United States Patent
Hwang et al.

(10) Patent No.: US 12,368,021 B2
(45) Date of Patent: Jul. 22, 2025

(54) INDUCTIVELY COUPLED PLASMA TYPE ION IMPLANTER

(71) Applicants: SK hynix Inc., Icheon (KR); INDUSTRY-UNIVERSITY COOPERATION FOUNDATION HANYANG UNIVERSITY, Seoul (KR)

(72) Inventors: Jong Jin Hwang, Icheon (KR); Sung Mook Jung, Icheon (KR); Seung Jae Moon, Seoul (KR)

(73) Assignees: SK hynix Inc, Icheon (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 200 days.

(21) Appl. No.: 18/329,407

(22) Filed: Jun. 5, 2023

(65) Prior Publication Data
US 2024/0021409 A1   Jan. 18, 2024

(30) Foreign Application Priority Data
Jul. 18, 2022   (KR) .......................... 10-2022-0088417

(51) Int. Cl.
*H01J 37/32* (2006.01)
*H01J 37/317* (2006.01)

(52) U.S. Cl.
CPC ........ *H01J 37/321* (2013.01); *H01J 37/3171* (2013.01); *H01J 37/3244* (2013.01); *H01J 2237/002* (2013.01)

(58) Field of Classification Search
None
See application file for complete search history.

(56) References Cited

U.S. PATENT DOCUMENTS

2005/0263390 A1* 12/2005 Gung .................... H01J 37/321
                                                                   204/192.15

FOREIGN PATENT DOCUMENTS

JP         2008159802 A    7/2008
WO     WO2007026889 A1    3/2007

OTHER PUBLICATIONS

C. Y. Ho et al., "Thermal Conductivity of the Elements", Journal of Physical and Chemical Reference Data, 1972, pp. 279, vol. 1, No. 2.
E. C. Neyts et al., "Molecular Dynamics Simulations for Plasma-Surface Interactions", Plasma Process and Polymers, Sep. 7, 2016, pp. 1600145, vol. 14, No. 1-2.

(Continued)

*Primary Examiner* — Kenneth B Wells

(57) ABSTRACT

An inductively coupled plasma type ion implanter may include a reaction tube, an induction coil surrounding the reaction tube, an aperture structure arranged over the reaction tube, a showerhead arranged on a lower surface of the reaction tube, a flange arranged under the showerhead, first and second aperture adaptors connected between the flange and the aperture structure, a gas line receiving the reaction gas from the flange and transferring the reaction gas to the showerhead and a cooling line receiving a cooling fluid from the flange. A circulation length of the cooling line around the flange is longer than a circulation length of the gas line around the flange.

11 Claims, 9 Drawing Sheets

(56) References Cited

OTHER PUBLICATIONS

M. Y. Naz et al., "Double and triple langmuir probes measurements in inductively coupled nitrogen plasma", Progress in Electromagnetics Research, 2011, vol. 114.
R. Kantor, "Modelling of a coupled radiation-conduction heat transfer through a heat shield in vaccum thermal isolation applications", IX International Conference on Computational Heat and Mass Transfer, ICCHMT2016, Procedia Engineering, 2016, pp. 271, vol. 157.
J. Hopwood, "Review of inductively coupled plasmas for plasma processing", Plasma Sources Science and Technology, 1992, pp. 109, vol. 1, No. 2.
T. H. Lee, "A Review of Ion Beam Technology", Journal of The Korea Institute of Military Science and Technology, Dec. 5, 2011, vol. 14, No. 6.

\* cited by examiner

INDUCTIVELY COUPLED PLASMA TYPE ION IMPLANTER

CROSS-REFERENCE TO RELATED APPLICATION

The present application claims priority under 35 U.S.C. § 119(a) to Korean application number 10-2022-0088417, filed on Jul. 18, 2022, in the Korean Intellectual Property Office, which is incorporated herein by reference in its entirety.

BACKGROUND

1. Technical Field

Various embodiments generally relate to a semiconductor fabrication apparatus, and more particularly, to an ion implanter using plasma generated by an inductively coupled technology.

2. Related Art

Recently, as a semiconductor device may have been highly integrated and fined, it may be required to perform an ion implantation with a high concentration and a fine depth. In order to satisfy the requirement, a plasma ion implantation in place of low energy type ion implantation has been developed. A plasma ion implanter may convert a material into plasma without an ion source and an accelerator. The plasma ion implanter may implant impurities having a desired concentration and a depth into a desired region.

SUMMARY

According to embodiments, there may be provided an inductively coupled plasma type ion implanter. The inductively coupled plasma type ion implanter may include a reaction tube, an induction coil, an aperture structure, a showerhead, a flange, first and second aperture adaptors, a gas line and a cooling line. The induction coil may be configured to surround the reaction tube. The aperture structure may be arranged over the reaction tube. The showerhead may be arranged on a lower surface of the reaction tube to provide the reaction tube with a reaction gas for generating ions. The flange may be arranged under the showerhead. The flange may be spaced apart from the showerhead. The first and second aperture adaptors may be connected between the flange and the aperture structure at an outside of the reaction tube. The gas line may receive the reaction gas from an outside of the flange. The gas line may transfer the reaction gas to the showerhead. The cooling line may receive a cooling fluid, which may cool the reaction tube, from the outside of the flange. The gas line may discharge the cooling fluid to the outside of the flange. The gas line may have a circulation length circulating between an inner space of the showerhead and a peripheral portion of the showerhead. The circulation length of the gas line may be longer than a length of the cooling line. The cooling line may have a circulation length circulating the flange longer than a length of the gas line.

For example, the aperture structure may include an aperture and an aperture cover.

The aperture may include a lid arranged on an upper surface of the reaction tube and a slit formed at a central portion of the line through which the ions are discharged. The aperture cover may surround the aperture and connected to the aperture adaptors.

The ICP type ion implanter may further include a gas line plate between the showerhead and the flange. The gas line plate may be positioned adjacent to the showerhead rather than the flange. The gas line may include a first line extending from the flange to an upper end of the first aperture adaptor, a second line extending from an upper end of the first line to the gas line plate, a third line extending from the second line to the second aperture adaptor through an inside of the gas line plate, a fourth line extending from the third line to an upper end of the second aperture adaptor, a fifth line extending from an upper end of the fourth line to the gas line plate, a sixth line extending from a lower end of the fifth line to a central portion of the gas line plate through the inside of the gas line plate, and a seventh line extending from the sixth line to the showerhead.

According to example embodiments, there may be provided an inductively coupled plasma type ion implanter. The inductively coupled plasma type ion implanter may include a reaction tube, an induction coil, an aperture, a showerhead, a flange, first and second aperture adaptors, a gas line plate and a gas line. The induction coil may be configured to surround the reaction tube. The aperture may be arranged on an upper surface of the reaction tube. The showerhead may be arranged on a lower surface of the reaction tube to provide the reaction tube with a reaction gas for generating ions. The flange may be arranged under the showerhead. The first and second aperture adaptors may be connected between the flange and the aperture structure at an outside of the reaction tube. The gas line plate may be arranged between the showerhead and the flange. The gas line plate may be connected to the first and second aperture adaptors. The gas line may extend from the flange to the showerhead through the gas line plate to supply the reaction gas to the showerhead.

According to example embodiments, there may be provided an inductively coupled plasma type ion implanter. The inductively coupled plasma type ion implanter may include a reaction tube, an induction coil, an aperture, a showerhead, a flange, first and second aperture adaptors, a gas line plate and a gas line. The induction coil may be configured to surround the reaction tube. The aperture may be arranged on an upper surface of the reaction tube. The showerhead may be arranged on a lower surface of the reaction tube to provide the reaction tube with a reaction gas for generating ions. The flange may be arranged under the showerhead. The first and second aperture adaptors may be connected between the flange and the aperture structure at an outside of the reaction tube. The gas line plate may be arranged between the showerhead and the flange. The gas line plate may be connected to the first and second aperture adaptors. The gas line may extend from the flange to the showerhead through the first aperture adaptor, the gas line plate, the second aperture adaptor and the gas line plate to supply the reaction gas to the showerhead.

According to example embodiments, there may be provided an inductively coupled plasma type ion implanter. The inductively coupled plasma type ion implanter may include a reaction tube, an induction coil, an aperture, a showerhead, a flange, first and second aperture adaptors, a gas line plate and a gas line. The induction coil may be configured to surround the reaction tube. The aperture may be arranged on an upper surface of the reaction tube. The showerhead may be arranged on a lower surface of the reaction tube to provide the reaction tube with a reaction gas for generating ions. The flange may be arranged under the showerhead. The first and second aperture adaptors may be connected between the flange and the aperture structure at an outside of the reaction tube. The gas line plate may be arranged between the showerhead and the flange. The gas line plate may be connected to the first and second aperture adaptors. The gas line may directly extend from the flange to the showerhead to supply the reaction gas to the showerhead.

According to embodiments, the circulation length of the gas line for transferring the reaction gas, which may circulate from the inner space of the showerhead to the peripheral portion of the showerhead, may be longer than the length of the cooling line. Further, the circulation length of the cooling line, which may circulate the flange, may be longer than the length of the gas line. Thus, the gas line extending from the flange may be connected with the showerhead through the gas line plate, not again through the flange. Therefore, a thermal exchange between the gas line and the cooling line may not be generated to suppress the reaction gas in the gas line from being cooled. As a result, the reaction gas may have a sufficient high temperature so that the reaction gas may also be sufficiently ionized.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein, but may include variations in such configurations and shapes.

The embodiments are described herein with reference to cross-section and/or plan views of embodiments of the present disclosure. However, embodiments of the present disclosure should not be construed as limiting the inventive concept. Although a few embodiments of the present disclosure will be shown and described, it will be appreciated by those of ordinary skill in the art that changes may be made.

Figure 1:
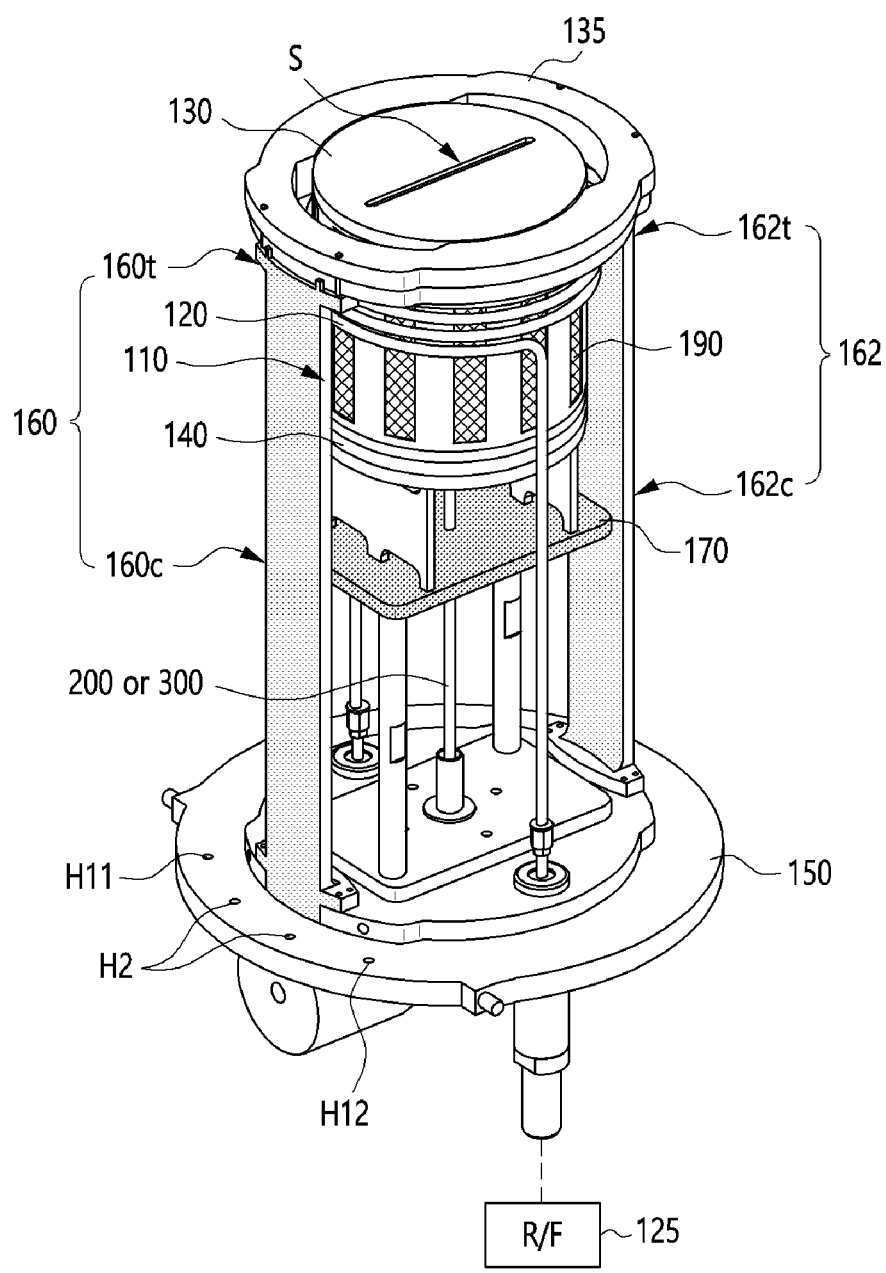
FIG. 1 is a perspective view illustrating an inductively coupled plasma type ion implanter in accordance with an embodiment.
Figure 2:
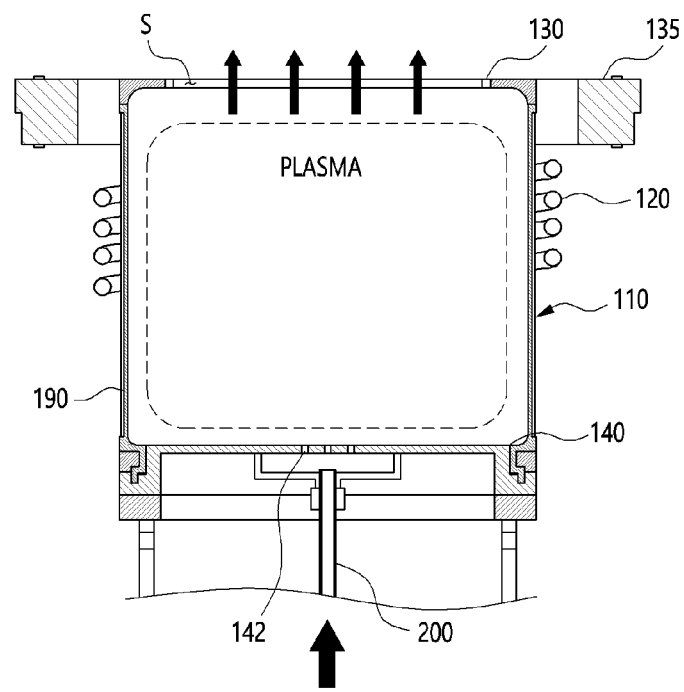
FIG. 2 is a cross-sectional view illustrating a plasma generation of the ion implanter in FIG. 1.
Figure 3:
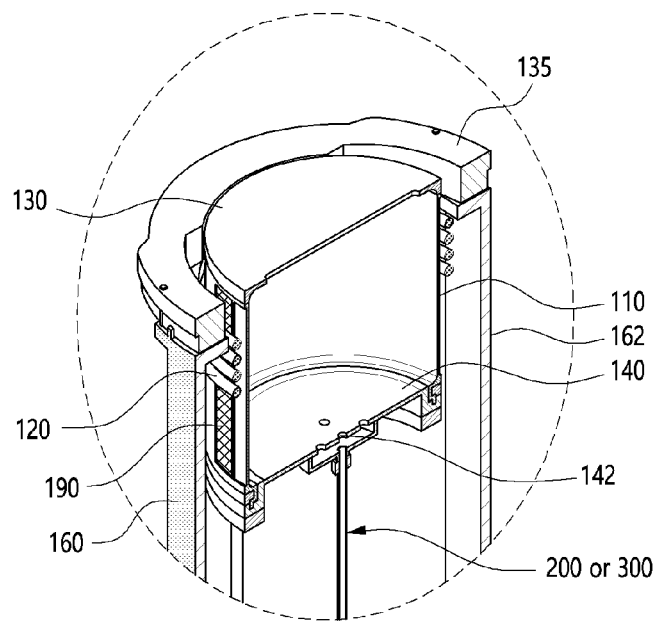
FIG. 3 is a perspective view illustrating a showerhead of the ion implanter in FIG. 1.
Figure 4:
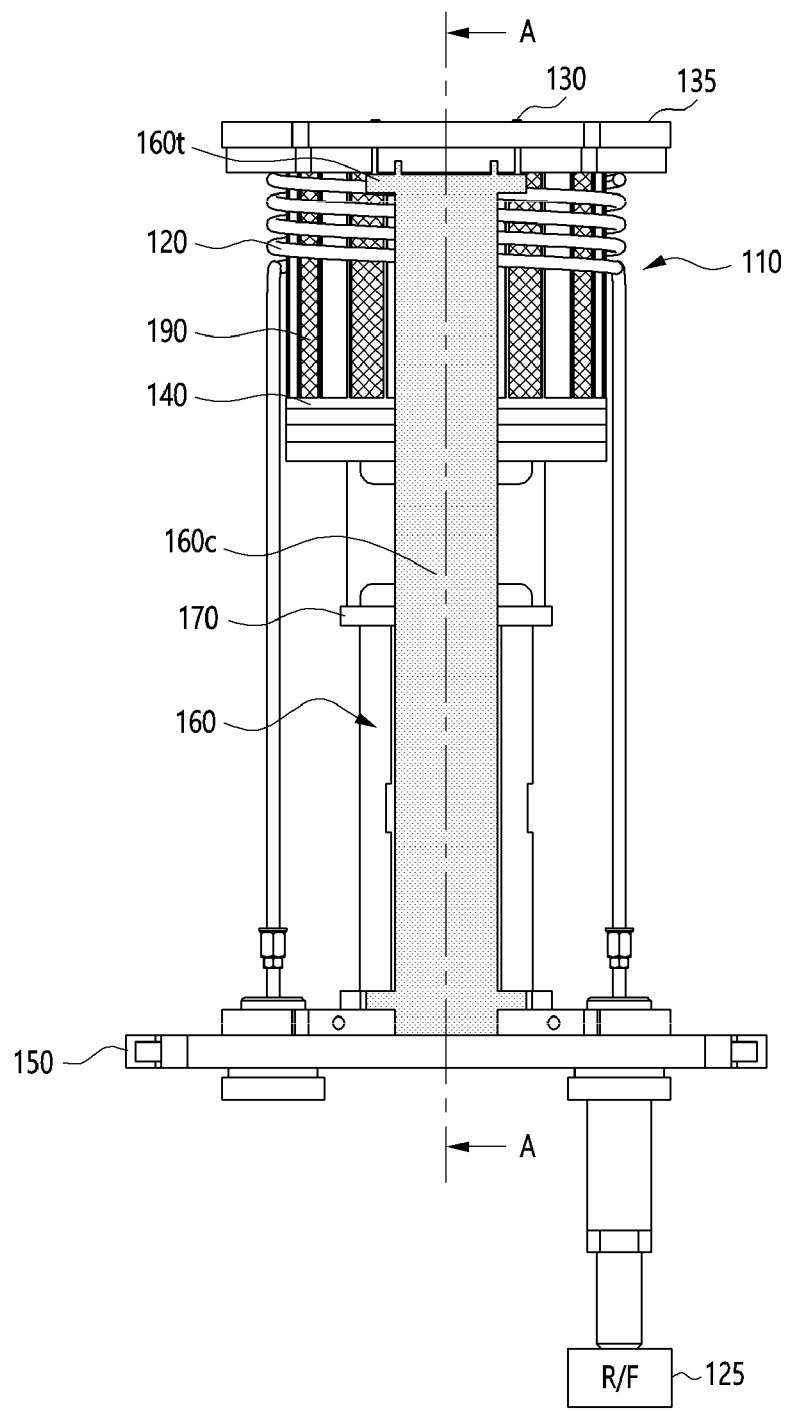
FIG. 4 is a cross-sectional view illustrating the ion implanter in FIG. 1.
Figure 5:
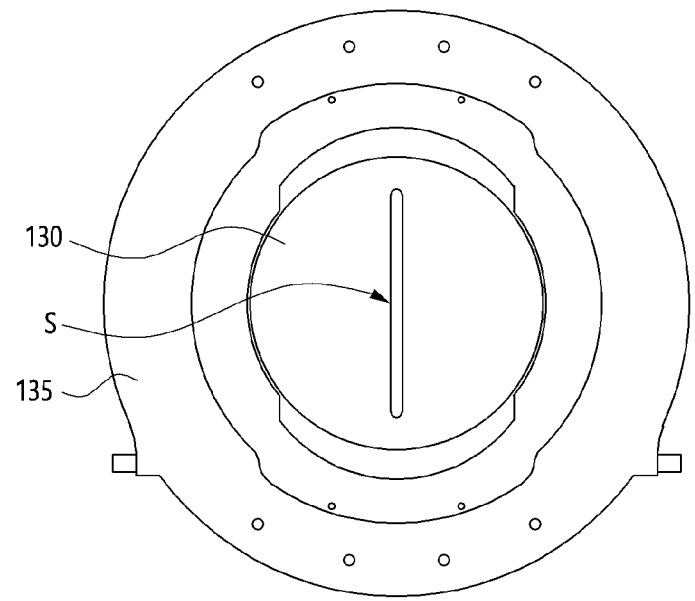
FIG. 5 is a plan view illustrating the ion implanter in FIG. 1.
Figure 6:
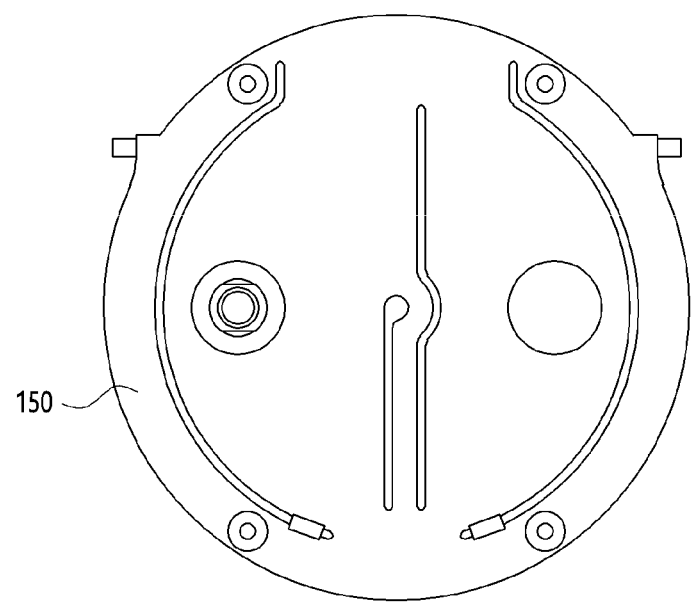
FIG. 6 is a bottom view illustrating the ion implanter in FIG. 1.
Figure 7:
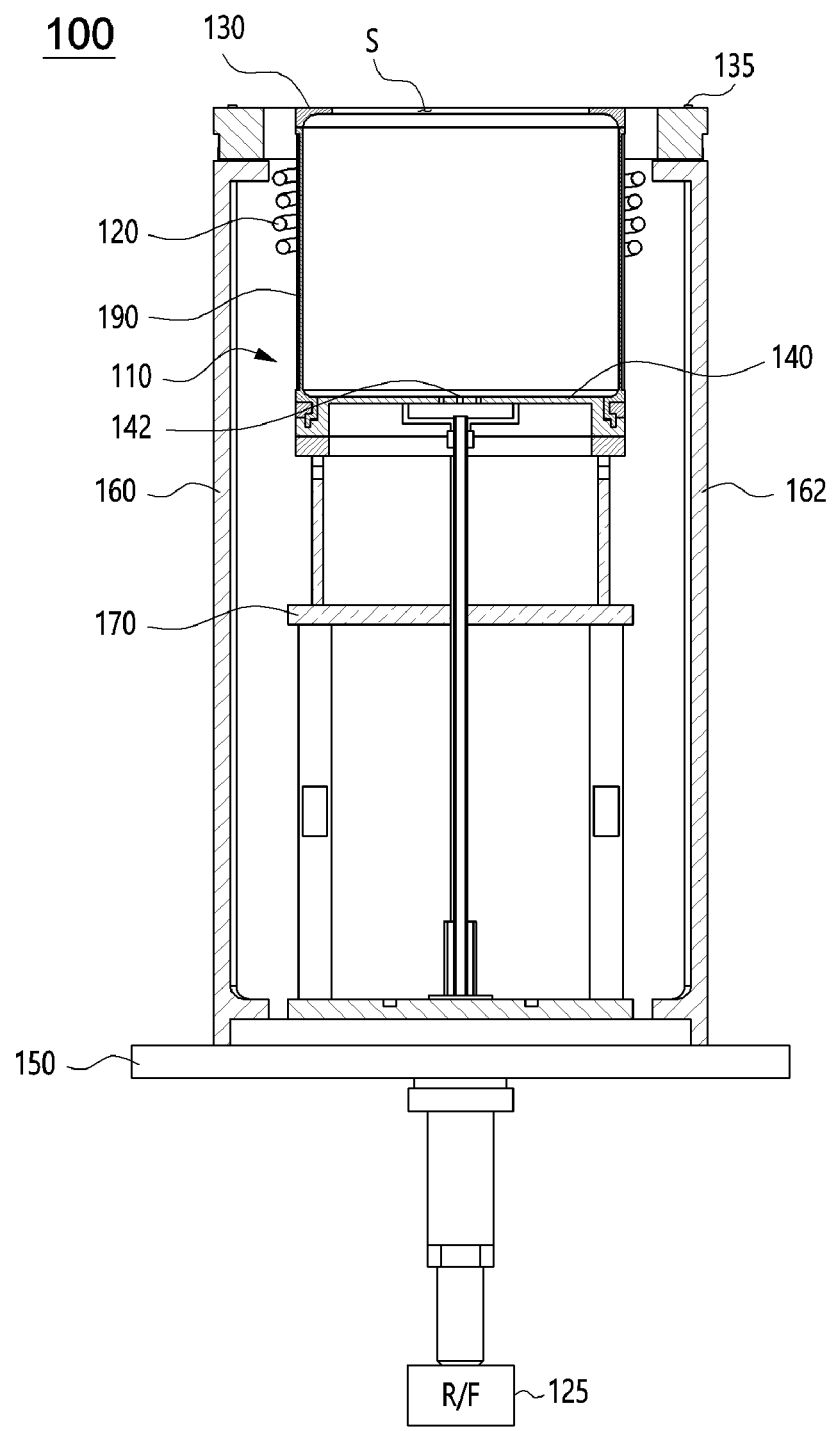
FIG. 7 is a cross-sectional view taken along a line A-A' in FIG. 4.

FIG. 1 is a perspective view illustrating an inductively coupled plasma type ion implanter in accordance with an embodiment, FIG. 2 is a cross-sectional view illustrating a plasma generation of the ion implanter in FIG. 1, FIG. 3 is a perspective view illustrating a showerhead of the ion implanter in FIG. 1, FIG. 4 is a cross-sectional view illustrating the ion implanter in FIG. 1, FIG. 5 is a plan view illustrating the ion implanter in FIG. 1, FIG. 6 is a bottom view illustrating the ion implanter in FIG. 1, and FIG. 7 is a cross-sectional view taken along a line A-A' in FIG. 4.

A general plasma ion implanter using a DC arc discharge may require providing a high power to a filament for generating plasma. The plasma may be generated at a temperature of about 1,000° C. The high temperature and the high pressure condition may damage the filament and thereby contaminate the ion implanter. Embodiments may provide an inductively coupled plasma type ion implanter capable of improving dissociation characteristics of a reaction gas without the high temperature and the high pressure.

Referring to FIGS. 1 to 7, an inductively coupled plasma (ICP) type ion implanter 100 may include a reaction tube 110, an induction coil 120, an aperture structure, a showerhead 140, a flange 150, a first aperture adaptor 160, a second aperture adaptor 162, a gas line plate 170, a shield 190, a cooling line 180 and a gas line 200 or 300.

The ICP type ion implanter 100 may generate plasma in the reaction tube 110 from a reaction gas using an electric field and a magnetic field induced by the induction coil 120. The reaction tube 110 may include a dielectric material such as ceramic, but embodiments of the present disclosure are not limited thereto. The reaction tube 110 may have a cylindrical shape, but embodiments of the present disclosure are not limited thereto. The reaction tube 110 may include an ion injection source. The ion injection source may be dissociated from the plasma-stated reaction gas to discharge desired ions. In embodiments, the ion injection source may include a component having strong bond strength between atoms such as $BF_3$.

The induction coil 120 may be arranged on an outer circumferential surface of the reaction tube 110. Particularly, the induction coil 120 may be at least once wound on the reaction tube 110. For example, the induction coil 120 may be connected to a high-frequency power source 125 including an RF power supply and an impedance matching unit to receive a high-frequency power, for example, an RF power. The high-frequency power induced to the induction coil 120 may be applied to the reaction tube 110.

The shield 190 may be a Faraday shield. The shield 190 may be arranged on the outer circumferential surface of the reaction tube 110 to control the electric field and the magnetic field generated from the induction coil 120. For example, the shield 190 may include at least one metal bar extending in a direction substantially perpendicular to a current direction generated from the induction coil 120. When the shield 190 may include a conductive material, the shield 190 may be grounded.

The aperture structure may include an aperture 130 and an aperture cover 135. The aperture 130 may be a lid configured to cover an upper surface of the reaction tube 110. The aperture 130 may have a slit formed at a central portion of the aperture 130. The slit may correspond to an ion-discharging portion. The aperture 130 may be supported by the aperture cover 135 installed around the aperture 130.

The showerhead 140 may be arranged in the reaction tube 110. The showerhead 140 may face the aperture 130. The showerhead 140 may include at least one injection hole 142. The reaction gas may be transferred from the gas line 200 or 300. The reaction gas may be injected into the reaction tube 110 through the injection hole 142 of the showerhead 140. For example, the reaction gas may include an inert gas such as an argon gas.

The flange 150 may be spaced apart from the showerhead 140. The flange 150 may include a cooling fluid inlet hole H11 and a cooling fluid outlet hole H12. The flange 150 may include at least one reaction gas inlet hole H2.

The first aperture adaptor 160 and the second aperture adapter 162 may be connected between the flange 150 and the aperture cover 135 to support the flange 150 and the aperture cover 135. The first aperture adaptor 160 and the second adaptor aperture 162 may be spaced apart from each other by a uniform gap, for example, about 180° outside the reaction tube. The first aperture adaptor 160 and the second aperture adaptor 162 may have a vertically extending plate shape, but embodiments of the present disclosure are not limited thereto. Further, the ion implanter 100 may include the two aperture adaptors 160 and 162, but embodiments of the present disclosure are not limited thereto. For example, the ion implanter 100 may include one aperture adaptor, or at least three aperture adaptors.

The gas line plate 170 may be arranged between the showerhead 140 and the flange 150. The gas line plate 170 may be configured to support the gas line 200. For example, the gas line plate 170 may be positioned between the first and second aperture adaptors 160 and 162. The gas line plate 170 may traverse the ion implanter 100. For example, the gas line plate 170 may be positioned closer to the showerhead 140 than the flange 150. The structures of the gas line plate 170 and the gas line 200 or 300 may be illustrated later in more detail.

When the high-frequency power is applied, the heat may be transferred from the reaction tube 110 to the aperture adaptors 160 and 162 through the aperture 130 and the aperture cover 135. Because the thermal conduction may be performed through a conductive material, the heat generated from the high-frequency power source 125 may be sequentially transferred from the shield 190 of the reaction tube 110 to the aperture adaptors 160 and 162 through the aperture 130 and the aperture cover 135. In other words, heat generated in the reaction tube 110 by applying power from the high-frequency power source 125 to the induction coil 120 may be transferred by thermal conduction from the reaction tube 110 to the aperture adaptors 160 and 162 through the aperture 130 and the aperture cover 135.

Figure 8:
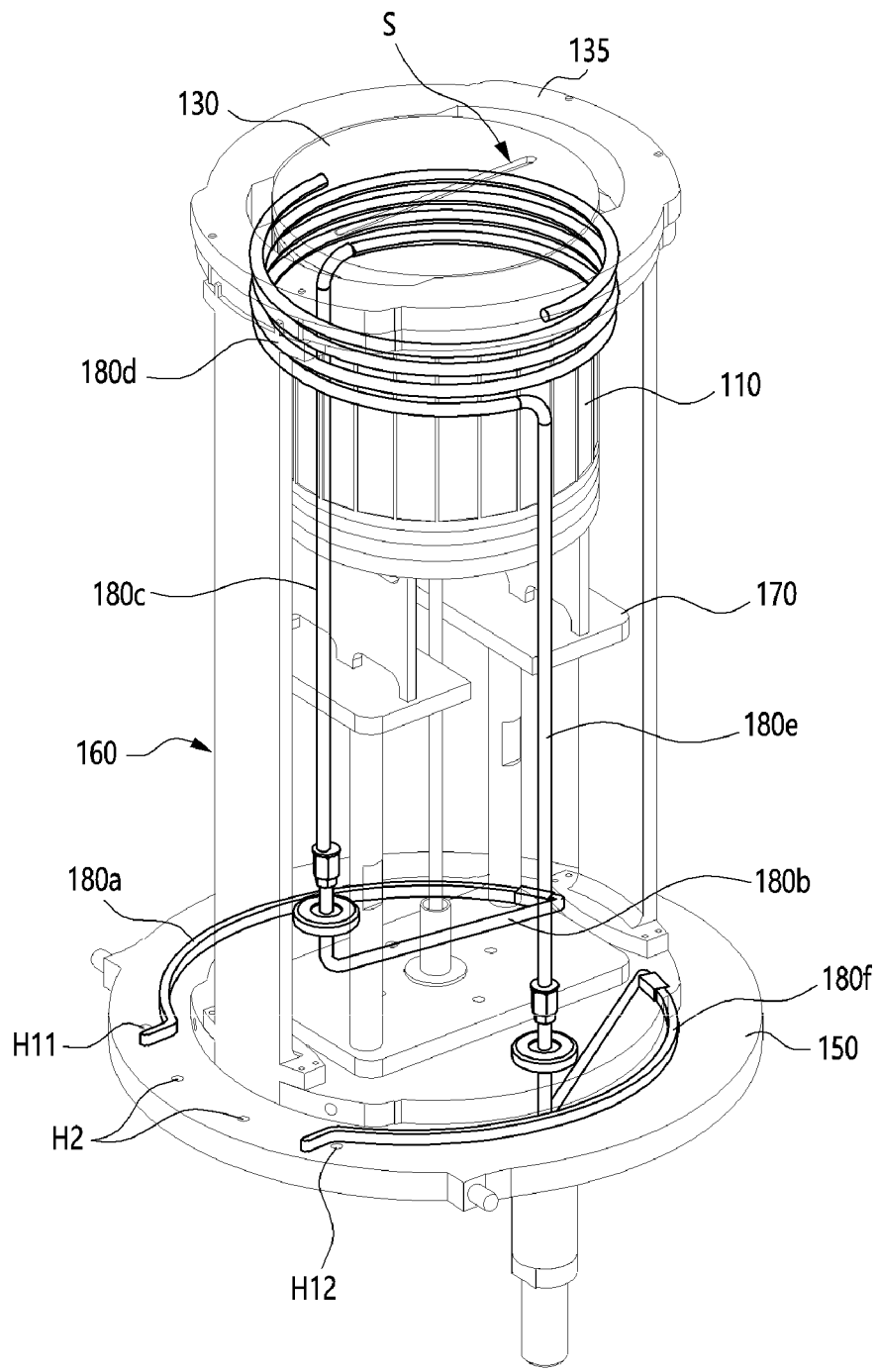
FIG. 8 is a perspective view illustrating a cooling line of the ion implanter in FIG. 1.

FIG. 8 is a perspective view illustrating a cooling line of the ion implanter 100 in FIG. 1.

Referring to FIG. 8, the cooling line 180 may extend from the cooling fluid inlet hole H11 to the cooling fluid outlet hole H12 in the flange 150 without a disconnection. The cooling line 180 may include a first portion 180a, a second portion 180b, a third portion 180c, a fourth portion 180d, a fifth portion 180e and a sixth portion 180f. The first portion 180a may extend from the cooling fluid inlet hole H11 of the flange 150 along one edge of the flange 150. The second portion 180b may extend from an end of the first portion 180a toward any one of the first aperture adaptor 160 and the second aperture adaptor 162 remote from the second portion 180b. For example, the second portion 180b may extend toward the first aperture adaptor 160. The third portion 180c may be substantially vertically extend from an end of the second portion 180b along an extending direction of the first aperture 160. The fourth portion 180d may extend from an end of the third portion 180c. The fourth portion 180d may be at least once wound on the reaction tube 110. The fourth portion 180d may be different from the induction coil 120. The induction coil 120 is not be depicted in FIG. 8 for the interest of brevity and clarity. The fifth portion 180e may substantially vertically extend from an end of the fourth portion 180d toward the other edge of the flange 150. For example, the fifth portion 180e may be positioned at or adjacent to one sidewall of the second aperture adaptor 162 facing the second portion 180b. The sixth portion 180f may extend from an end of the fifth portion 180e to the cooling fluid outlet hole H12 along the other edge of the flange 150. For example, the sixth portion 180f may include at least one bent portion to provide the sixth portion 180f with a long path. In an embodiment, the cooling line 180 has a circulation length around the flange 150 that is relatively long. For example, the circulation length of the cooling line 180 may include a first length of the first portion 180a and a second length of the sixth portion 180f that are disposed in the flange 150. In an embodiment, the circulation length of the cooling line 180 around the flange 150 may be longer than a circulation length of the gas line 200 or 300 around the flange 150. For example, the circulation length of the gas line 200 or 300 may be a length of a portion of the gas line 200 or 300 disposed in the flange 150.

As mentioned above, the reaction tube 110 may form the plasma at the high temperature by the high-frequency power applied by the induction coil 120. Thus, the cooling fluid may flow through the third to fifth portions 180c, 180d and 180e of the cooling line 180, which may be spaced apart from the first and second aperture adaptors 160 and 162, to be heated. The heated cooling fluid may flow through the sixth portion 180f of the flange 150, which may be spaced apart from the reaction tube 110 and may include the bent portion to have the long path, before being discharged through the cooling fluid outlet hole H12 so that the temperature of the cooling fluid may be decreased.

The cooling line 180 may pass through the reaction tube 110 and the peripheral portion of the reaction tube 110 to decrease the temperatures of the aperture structure and the aperture adaptors 160 and 162. The cooling line 180 may circulate around the flange 150, which may have the lowest temperature in the ion implanter, through the long path. Thus, the temperature of the cooling fluid may be still maintained. Further, the temperature of the outputted cooling fluid may also be decreased.

According to embodiments, the gas line 200 may be a line through which the reaction gas may be introduced. The gas line 200 may be spaced apart from the cooling line 180 to suppress a heat exchange between the reaction gas and the cooling fluid.

Figure 9:
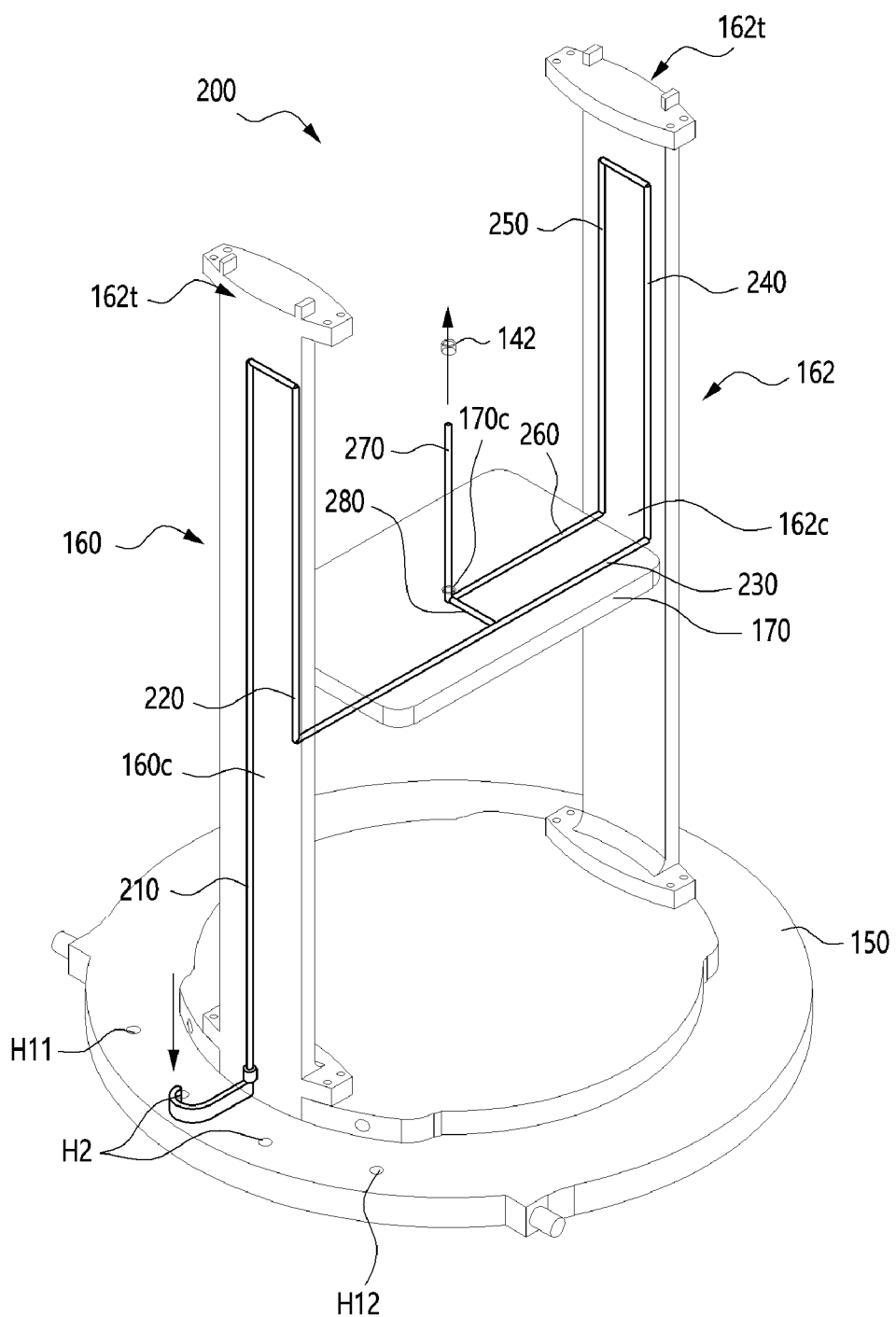
FIG. 9 is a perspective view illustrating a gas line of the ion implanter in FIG. 1 in accordance with an embodiment.

FIG. 9 is a perspective view illustrating a gas line 200 of the ion implanter in FIG. 1 according to an embodiment.

Referring to FIGS. 1, 8, and 9, the gas line 200 may extend from the flange 150 to the showerhead 140 through the gas line plate 170. That is, the gas line 200 may be connected with the showerhead 140 via the gas line plate 170, while minimizing the reaction gas flowing through the flange 150.

Particularly, the gas line 200 may include a first line 210, a second line 220, a third line 230, a fourth line 240, a fifth line 250, a sixth line 260 and a seventh line 270. The first line 210 may extend from the flange 150 to an upper end portion 160t of the first aperture adaptor 160. The second line 220 may extend from an upper end of the first line 210 to one side surface of the gas line plate 170 through a middle portion 160c of the first aperture adaptor 160. The third line 230 may extend from the second line 220 to the other side surface of the gas line plate 170, i.e., the second aperture adaptor 162 through an inner space of the gas line plate 170. The fourth line 240 may extend from the third line 230 to an upper end portion 162t of the second aperture adaptor 162. The fifth line 250 may extend from an upper end of the fourth line 240 to the other side surface of the gas line plate 170 through a middle portion 162c of the second aperture adaptor 162. The sixth line 260 may extend from the fifth line 250 to a central portion 170c of the gas line plate 170 through the inner space of the gas line plate 170. The seventh line 270 may extend upwardly from the sixth line 260 to the showerhead 140. That is, an upper end of the seventh line 270 may be connected to the injection holes 142 of the showerhead 140 to transfer the reaction gas to the showerhead 140.

Additionally, the gas line 200 may further include an eighth line 280. The eighth line 280 may be connected between the third line 230 and the seventh line 270. That is, the eighth line 280 may be connected between a central portion of the third line 230 and a lower end of the seventh line 270. Thus, a part of the reaction gas flowing through the third line 230 may be directly introduced into the seventh line 270 through the eighth line 280, rather than being introduced into the fourth line 240.

Therefore, the gas line 200 extend from the flange 150 may be connected with the showerhead 140 through the gas line plate 170 over the flange 150.

Thus, the reaction gas in the gas line 200 may not be directed to the flange 150 through which the cooling fluid having the low temperature may flow. Therefore, the cooling of the reaction gas in the gas line 200 by the cooling fluid having the low temperature may be reduced. As a result, the reaction gas may have a sufficiently high temperature so that the reaction gas may be readily ionized by the high-frequency power. That is, a circulation length of the gas line 200 through the gas line plate 170 and the first and second aperture adaptors 160 and 162, which may correspond to the peripheral portion of the showerhead 140, may be longer than a circulation length of the gas line 200 around the flange 150 to extend a heating time of the gas line 200, thereby improving the ionization characteristics. Specifically, the gas line 200 may include a flow path in a peripheral portion of the showerhead 140 including the gas line plate 10 and the first and second aperture adaptors 160 and 162. In an embodiment, such a flow path of the gas line 200 may include the first and second lines 210 and 220 that are disposed in the first aperture adaptor 160, the third, sixth, and eighth lines 230, 260, and 280 that are disposed in the gas line plate 170, and fourth and fifth lines 240 and 250 disposed in the second aperture adaptor 162. For example, a length of the flow path of the gas line 200 in the peripheral portion of the showerhead 140 may be longer than that of a circulation path of the cooling line 150 around the flange 150 (e.g., one or more portions of the gas line 200 disposed in the flange 150). Since the temperatures of the first aperture adaptor 160, the gas line plate 170, and the second aperture adaptor 160 are higher than the temperature of the flange 150, the reaction gas entering the showerhead 140 through the gas line 200 may be sufficiently high to achieve desirable ionization characteristics.

Figure 10:
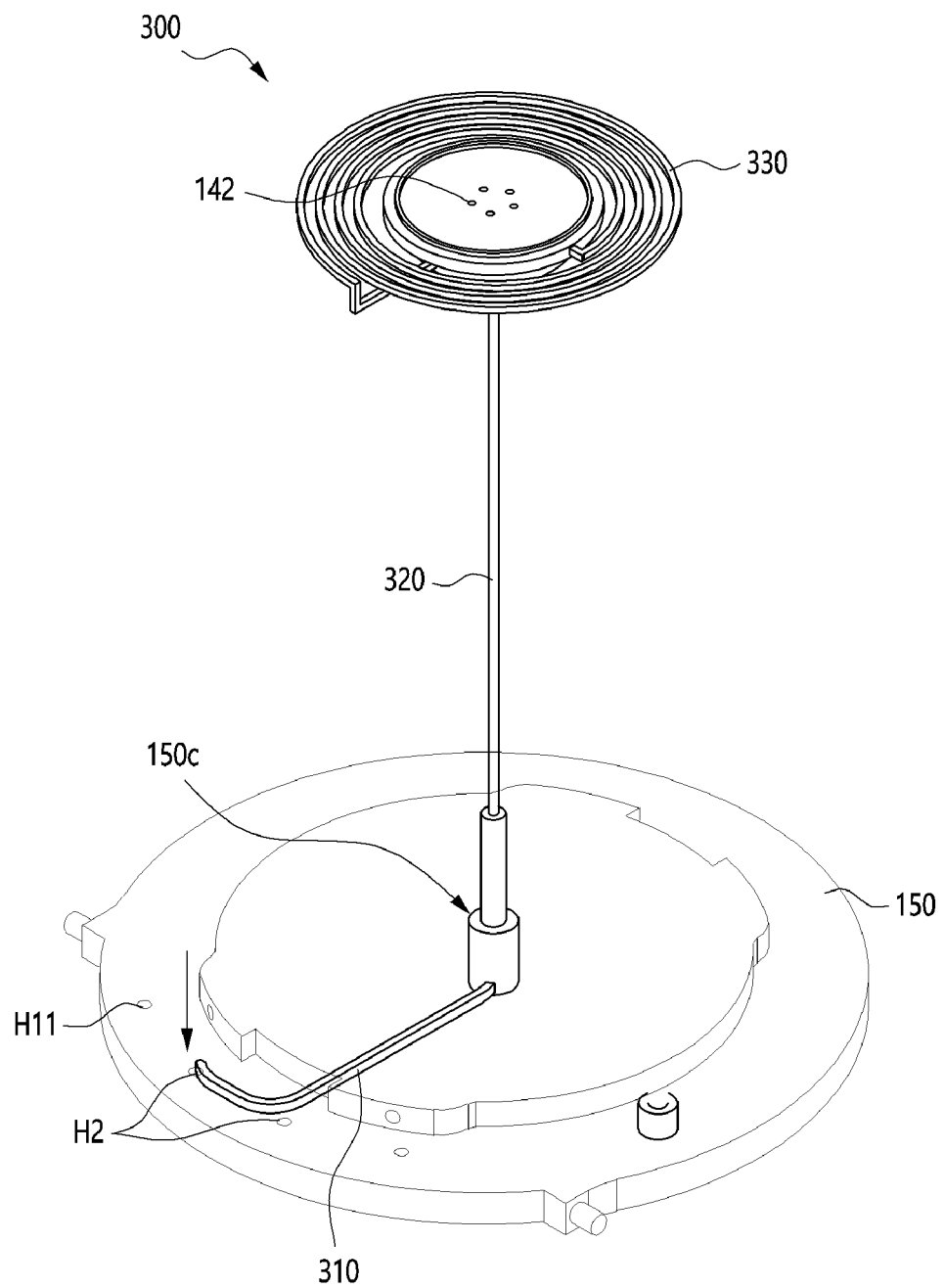
FIG. 10 is a perspective view illustrating a gas line of the ion implanter in accordance with an embodiment.
Figure 11:
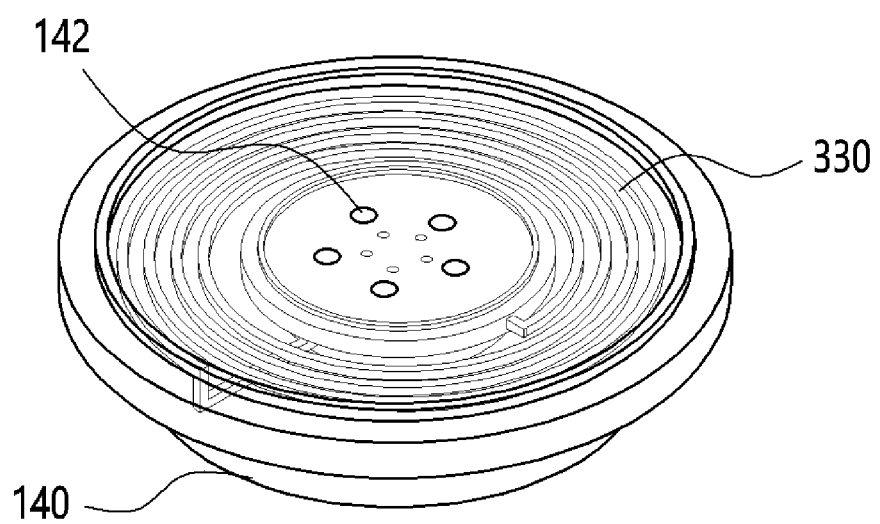
FIG. 11 is a perspective view illustrating a showerhead connected to the gas line in FIG. 10.

FIG. 10 is a perspective view illustrating a gas line of the ion implanter in accordance with an embodiment, and FIG. 11 is a perspective view illustrating a showerhead connected to the gas line in FIG. 10.

Referring to FIGS. 1, 8, 10, and 11, a gas line 300 may include a first line 310, a second line 320, and a gas passage 330.

The first line 310 may extend through an inside of the flange 150 and from a side surface of the flange 150 toward a central portion 150c of the flange 150. For example, the first line 310 may include a first portion extending through an inside of the flange 150 and a second portion extending from the side surface of the flange 150 toward a central portion 150c of the flange 150. The second line 320 may extend from an end of the first line 310 at the central portion 150c of the flange 150. The second line 320 may be directly connected to the showerhead 140. The second line 320 may be connected with the showerhead 140 through the gas line plate 170, but embodiments of the present disclosure are not limited thereto. For example, the second line 320 may be connected to the showerhead 140 through an outskirt of the gas line plate 170.

The second line 320 of the gas line 300 is spaced apart from the flange 150 through which the cooling fluid having a low temperature flows, and thus the reaction gas in the gas line 300 may not be significantly cooled by the cooling fluid having the low temperature. As a result, the reaction gas may have a sufficiently high temperature so that the reaction gas may be easily ionized by the high-frequency power.

The gas passage 330 may be formed in the showerhead 140. The gas passage 330 may be connected to the second line 320. The gas passage 330 may be connected with the injection holes 142 of the showerhead 140 to supply the reaction gas to the injection holes 142. Thus, the reaction gas flowing through the second line 320 may be introduced into the gas passage 330 in the showerhead 140.

In embodiments, the gas passage 330 may have a spiral shape in the showerhead 140. The gas passage 330 may be wound toward a region where one or more injection holes 142 may be positioned. For example, a first end of the gas passage 330 having the spiral shape may be connected to the second line 320, and a second end of the gas passage 330 may be connected to a portion in the showerhead 140 having a top surface in which the injection holes 142 are formed. Thus, the reaction gas may flow through the long gas passage 330. The reaction gas may then be injected into the reaction tube 110 through the injection holes 142. As mentioned above, the gas passage 330 may be arranged in the showerhead 140. The showerhead 140 may correspond to the bottom surface of the reaction tube 110 having a high temperature. Thus, the showerhead 140 may have a temperature similar to the high temperature of the reaction tube 110. For example, the temperature of the ICP type reaction tube 110 may be about 500° C. to about 700° C., which is lower than about 1,000° C. in a DC arc discharge type ion implanter. Although the temperature of the reaction tube 110 of the ICP type ion implanter 100 may be lower than the temperature of the DC arc type, during the reaction gas may circulate the gas passage 330, a relatively large amount of heat of the reaction tube 110 may be transferred to the gas passage 330 so that the reaction gas may be self-heated. For example, the ICP type ion implanter 100 according to an embodiment of the present disclosure may use heat generated of the reaction tube 110 to increase the temperature of the reaction gas flowing through the gas passage 330, thereby obviating the need for a separate heater to increase the temperature of the reaction gas. Therefore, the sufficiently heated reaction gas may be introduced into the reaction tube 110 so that the ionized amount of the inert gas may be increased to generate the high-density plasma. The high-density plasma may ionize a source such as $BF_3$ having high bonding strength to inject the ions having a desired density to a desired region.

According to embodiments, a gas line for transferring a reaction gas may include a flow path in an inner space of the showerhead, or a peripheral portion of the showerhead, or both to make the flow path relatively long to sufficiently increase a temperature of the reaction gas entering the showerhead for desirable ionization characteristics. Further, the circulation length of the cooling line around the flange, which may circulate the flange, may be longer than the circulation length of the gas line around the flange. Thus, the gas line extended from the flange may be connected with the showerhead through the gas line plate, but may not be connected again to extend through the flange. As a result, the reaction gas may have a sufficient high temperature so that the reaction gas may also be sufficiently ionized.

The above described embodiments of the present disclosure are illustrative and not intended to limit various embodiments of the present disclosure. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. An inductively coupled plasma (ICP) type ion implanter comprising:
   a reaction tube;
   an induction coil configured to surround the reaction tube;
   an aperture structure arranged over the reaction tube;
   a showerhead arranged on a lower surface of the reaction tube to provide the reaction tube with a reaction gas for generating ions;
   a flange arranged under the showerhead, the flange being spaced apart from the showerhead;
   first and second aperture adaptors connected between the flange and the aperture structure;
   a gas line receiving the reaction gas from the flange and transferring the reaction gas to the showerhead; and
   a cooling line receiving a cooling fluid from the flange to decrease a temperature of the reaction tube and discharging the cooling fluid,
   wherein the gas line includes a flow path in an inner space of the showerhead, or a peripheral portion of the showerhead, or both, and
   wherein a circulation length of the cooling line around the flange is longer than a circulation length of the gas line around the flange.

2. The ICP type ion implanter of claim 1, wherein the aperture structure comprises:
   an aperture including a lid arranged on an upper surface of the reaction tube and a slit through which the ions are discharged, the slit being formed at a central portion of the aperture; and
   an aperture cover surrounding the aperture and connected to the first and second aperture adaptors.

3. The ICP type ion implanter of claim 1, further comprising a gas line plate between the showerhead and the flange, the gas line plate being positioned closer to the showerhead than to the flange,
   wherein the gas line comprises:
   a first line extending from the flange to an upper end portion of the first aperture adaptor;
   a second line extending from an upper end of the first line to the gas line plate;
   a third line extending from the second line to the second aperture adaptor through the gas line plate;
   a fourth line extending from the third line to an upper end portion of the second aperture adaptor;
   a fifth line extending from an upper end of the fourth line to the gas line plate;
   a sixth line extending from a lower end of the fifth line to a central portion of the gas line plate through the gas line plate; and
   a seventh line extending from the sixth line to the showerhead.

4. The ICP type ion implanter of claim 3, wherein the gas line further comprises an eighth line connected between a lower end of the seventh line and the third line.

5. The ICP type ion implanter of claim 1, wherein the gas line is directly connected to the inner space of the showerhead from the flange to circulate the inner space of the showerhead.

6. The ICP type ion implanter of claim 5, wherein the gas line comprises:
   a first line extending through and from the flange; and
   a gas passage formed in the showerhead.

7. The ICP type ion implanter of claim 6, wherein the gas passage has a spiral shape.

8. The ICP type ion implanter of claim 6, further comprising a gas line plate between the showerhead and the flange, the gas line plate being positioned closer to the showerhead than to the flange,
   wherein the gas line further comprises a second line connected between the first line and the gas passage through the gas line plate.

9. The ICP type ion implanter of claim 1, wherein the showerhead comprises a plurality of injection holes connected to the gas line.

10. The ICP type ion implanter of claim 1, wherein the first and second aperture adaptors are spaced apart from each other by a uniform gap.

11. The ICP type ion implanter of claim 1, further comprising a shield arranged between the reaction tube and the first and second aperture adaptors.

* * * * *